(12) United States Patent
Hanamoto et al.

(10) Patent No.: US 6,458,203 B1
(45) Date of Patent: Oct. 1, 2002

(54) SYSTEM FOR MANUFACTURING A SINGLE-CRYSTAL INGOT EMPLOYING CZOCHRALSKI TECHNIQUE, AND METHOD OF CONTROLLING THE SYSTEM

(76) Inventors: Tadayuki Hanamoto, 1200, Manda Hiratsuka-shi, Kanagawa (JP); Shigeo Morimoto, 1200, Manda Hiratsuka-shi, Kanagawa (JP); Masato Moriya, 1200, Manda Hiratsuka-shi, Kanagawa (JP); Toshirou Kotooka, 2612, Shinomiya Hiratsuka-shi, Kanagawa (JP)

( * ) Notice: Subject to any disclaimer, the term of this patent is extended or adjusted under 35 U.S.C. 154(b) by 0 days.

(21) Appl. No.: 09/561,379

(22) Filed: Apr. 27, 2000

(30) Foreign Application Priority Data

Apr. 28, 1999 (JP) ............................................ 11-122796

(51) Int. Cl.[7] .............................................. C30B 15/20
(52) U.S. Cl. ........................... 117/14; 117/20; 117/217; 117/218; 117/900
(58) Field of Search ............................ 117/14, 20, 217, 117/218, 900

(56) References Cited

U.S. PATENT DOCUMENTS 6,146,459 A * 11/2000 Park ........................... 117/217
6,206,961 B1 * 3/2001 Takeno et al. ................. 117/20

FOREIGN PATENT DOCUMENTS

| JP | A-08-268794 | 10/1996 |
|----|----|----|
| JP | A-08-330316 | 12/1996 |
| JP | A-08-337490 | 12/1996 |
| JP | H10-330713 | 11/1998 |
| JP | H11-071149 | 3/1999 |
| JP | H11-094695 | 4/1999 |
| JP | H11-094697 | 4/1999 |

* cited by examiner

*Primary Examiner*—Felisa Hiteshew
(74) *Attorney, Agent, or Firm*—Welsh & Katz, Ltd.

(57) ABSTRACT

There are provided a CZ system for manufacturing a single-crystal ingot, which produces a perfect crystal with good reproducibility through growth of a single-crystal ingot, as well as a method of manufacturing the single-crystal ingot. A system of manufacturing a single-crystal ingot by pulling a single-crystal ingot from molten raw material by means of a Czochralski technique, the system including measurement means for measuring the distance between the level of molten raw material and the bottom of a heat-shielding member. On the basis of the thus-measured distance, the temperature gradient of area G1 of the single-crystal pulled silicon ingot is controlled so as to produce a perfect crystal with good reproducibility, by means of controlling any factor for pulling a single-crystal silicon ingot selected from the group comprising the amount of heat applied to silicon melt, the level of silicon melt, and the pull rate of a single-crystal silicon ingot.

9 Claims, 4 Drawing Sheets

PULL LENGTH (LENGTH OF INGOT)

PULL LENGTH (LENGTH OF INGOT)

PULL LENGTH (LENGTH OF INGOT)

SYSTEM FOR MANUFACTURING A SINGLE-CRYSTAL INGOT EMPLOYING CZOCHRALSKI TECHNIQUE, AND METHOD OF CONTROLLING THE SYSTEM

BACKGROUND OF THE INVENTION

1. Field of the Invention

The present invention relates to a System and method for manufacturing a single-crystal ingot by means of the Czochralski technique (herein after referred to simply as the "CZ technique") and more particularly, to a system and method suitable for manufacturing a perfect-crystal silicon wafer of good quality.

2. Related Art

Crystal defects which arise in a CZ single-crystal silicon ingot during the course of growth of the ingot according to the CZ technique adversely affect the reliability of a gate oxide film of an MOS device or the leakage characteristic of a p–n junction. For these reasons, the crystal defects must be minimized. It has already been pointed out that appropriate control of a ratio V/G of a pull rate V of a single-crystal ingot which is being pulled in a furnace (hereinafter simply called a "single-crystal pulled ingot") to the temperature gradient G of the single-crystal pulled ingot is effective for controlling generation of crystal defects (see, for example, Japanese Patent Laid-Open No. 337490/1996).

The inventors who contrived the invention described in publication No. 337490/1996 produced a perfect crystal by appropriate control of the ratio V/G from 1300° C. to the melting point of silicon [see the 54$^{th}$ Technical Meeting of the Japan Society of Applied Physics (held for four days from Sep. 27 to 30, 1993)]. However, as described in the collection of proceedings of the 54$^{th}$ Technical Meeting of the Japan Society of Applied Physics (Proceeding No. 1, p. 303, 29a-HA-7) and Japanese Patent Laid-Open No. 330316/1996, the applicant of the present patent application has reported that a silicon of a perfect crystal is produced under more appropriate conditions by adequate control of the ratio V/G from 1350° C. to the melting point of silicon.

In order to produce a perfect crystal through growth of a CZ single-crystal ingot, the pull rate V and the temperature gradient G must be controlled to a high degree of accuracy.

Even if the growth rate V is controlled constantly, the temperature gradient G changes incessantly during the course of growth of a crystal, and the value of the ratio V/G also changes so as to follow the change in the temperature gradient G. Eventually, a complete crystal region cannot be formed at good yield in the direction of crystal growth.

To overcome this problem, according to the related art (Japanese Patent Laid-Open No. 268794/1996), an internal temperature distribution of the single-crystal ingot is determined through calculation of temperature distribution of the entire furnace by use of heat transfer calculation. The heat radiated from a melt is shielded and/or reflected on the basis of the thus-calculated temperature distribution of the furnace, to thereby control the internal temperature distribution of a single-crystal ingot. Through such a control, the growth rate V is controlled such that the value of the ratio V/G (mm$^2$/° C.×min.) approaches a target value, and the temperature gradient G is also controlled by means of shielding and/or reflecting the heat radiated from the melt.

According to the related art, the shielding of the heat radiated from the melt is controlled by changing the position of a heat-shielding member which is a standard component of a recent system for manufacturing a CZ single-crystal ingot. The recent system has a mechanism for vertically moving a radiation shield (i.e., a heat-shielding member) in order to control the degree to which the heat radiated from a melt to a single-crystal ingot is shielded. According to the background art, a radiation reflection member of high reflectivity is placed at a position above a melt, and the amount of heat radiated is controlled by means of controlling the angle of the radiation reflection member.

Further, according to the related art, a G-calculator is used for determining the temperature gradient G at temperatures ranging up to 1300° C. with respect to a crystal longitudinal axis. Various data sets, such as data pertaining to the position and angle of the radiation shield, are input to the G-calculator, thus calculating the temperature gradient G. On the basis of the temperature gradient G determined by the G-calculator and the growth rate V of a single-crystal, a V/G controller calculates the ratio V/G and controls the growth rate V such that the calculation result matches a predetermined V/G value, thereby regulating the position and angle of the radiation shield. Finally, the V/G ratio is controlled during the entire process.

However, in a case where the ratio V/G is controlled by changing the position and angle of the heat-shielding member, as in the case of the related art (i.e., Japanese Patent Laid-Open No. 268794/1996), additional members or mechanisms for actuating the heat-shielding member are required, thus introducing the disadvantages of an increase in the number of components and complicated control. More Specifically, under the method described in Japanese Patent Laid-Open No. 268794/1996, the heat radiated from a melt is shielded or reflected through use of various control devices such as those mentioned previously, thereby controlling a temperature gradient in the vicinity of the interface between solid and melt. An additional mechanism for controlling the position of the heat-shielding member and the angle of a reflecting member is required, thus greatly complicating the control of the ratio V/G.

Further, according to the related art, the temperature gradient G used for calculating the ratio V/G is computed basically through inference by use of simulation of a temperature. Therefore, the ratio V/G is not controlled so as to completely reflect the internal state of the furnace. Even if the growth rate V is constant, there may arise a case where the temperature gradient G is not actually controlled. In such a case, a perfect crystal cannot be produced with good yield in the direction of crystal growth.

The present invention has been conceived against the foregoing backdrop, and is aimed at providing a system and method of producing a perfect crystal with good reproducibility through growth of a single-crystal ingot. Further, the present invention provides a mechanism or method for use with a system of manufacturing a single-crystal ingot by means of the CZ technique, the mechanism or method being able to control a V/G ratio without involvement of a change in the position of a heat-shielding member.

SUMMARY OF THE INVENTION

To solve the drawbacks of the background art, there are provided a system and method of manufacturing a single-crystal ingot by means of the CZ technique according to the present invention, wherein a heat-shielding member is in principle placed in a fixed position, and the requirements for pulling a single-crystal ingot are controlled by means of measuring the distance between the bottom of the heat-shielding member and the level of molten raw material and feeding back the thus-measured distance.

In a system for manufacturing a single-crystal ingot by means of the CZ technique (hereinafter referred to simply as a "system"), a crucible for storing silicon melt is moved upward so as to compensate for a drop in the level of the molten raw material stemming from a reduction in the level of molten raw material caused by pulling of a single-crystal ingot. The distance between the bottom of the heat-shielding member and the level of the molten raw material remains essentially constant. However, there is a case where a minute change arises in the distance, for reasons of a discrepancy between the rate at which the crucible is moved vertically and reduction in the level of the molten raw material, improper control of vertical movement of the crucible, deformation of the heat-shielding member caused by the internal heat of the furnace, or a change in the state of the level of the molten raw material, such as ripples. The inventors have found that even a change in the distance between the bottom of the heat-shielding member and the level of the molten raw material is on the order of millimeters, and that such a change cannot be disregarded in the process for producing a perfect crystal, thus leading to completion of the present invention.

Vertical movement of the heat-shielding member have been practiced from a macroscopic viewpoint. However, minute control of vertical movement of the heat-shielding member has not been effected, and a necessity for such minute control has not yet arisen. Particularly, changing the controlling conditions for pulling a single-crystal ingot in association with a minute change of the order of millimeters in the distance between the lower end of the heat-shielding member and the level of molten raw material has not been effected thus far. The present invention has a technical significance in that, in the course of a process for producing a perfect crystal, a minute change of the order of millimeters in the distance between the lower end of the heat-shielding member and the level of the molten raw material is taken as a major factor for determining the requirements for pulling a single-crystal ingot.

More specifically, the present invention provides a system for manufacturing a single-crystal ingot by means of the Czochralski technique (hereinafter referred to simply as the "CZ technique").

(1) A system for manufacturing a single-crystal ingot by pulling a single-crystal ingot from molten raw material which has a heat-shielding member disposed so as to surround the single-crystal ingot being pulled (hereinafter referred to simply as a "single-crystal pulled ingot") for controlling the amount of heat applied to the single-crystal pulled ingot, the system comprising:

measurement means for measuring the distance between the bottom of the heat-shielding member and the level of the molten raw material; and a controller for controlling the requirements of pulling a single-crystal ingot on the basis of the distance measured by the measurement means.

(2) Preferably, the system comprises a cooler for cooling a portion of the single-crystal pulled ingot.

(3) Preferably, the system corresponds to a system for manufacturing a single-crystal silicon ingot, and the requirements of pulling a single-crystal silicon ingot correspond to any factor selected from the group comprising the amount of heat applied to silicon melt, the level of silicon melt, and the pull rate of a single-crystal silicon ingot (hereinafter referred to as a "single-crystal silicon pulled ingot").

(4) Preferably, a perfect crystal silicon wafer is produced by means of slicing the single-crystal silicon ingot.

Further, the present invention provides the following method of manufacturing a single-crystal silicon by use of the CZ technique.

(5) A method of manufacturing a single-crystal ingot by pulling a single-crystal ingot from molten raw material, the method comprising the steps of:

measuring the distance between the level of molten raw material and the bottom of a heat-shielding member disposed so as to surround the single-crystal ingot being pulled (hereinafter referred to simply as a "single-crystal pulled silicon ingot") for controlling the amount of heat applied to the single-crystal pulled ingot; and controlling any factor for pulling a single-crystal silicon ingot selected from the group comprising the amount of heat applied to silicon melt, the level of silicon melt, and the pull rate of a single-crystal silicon ingot, thereby controlling the temperature gradient of area G1 of the single-crystal pulled silicon ingot.

(6) The temperature gradient of area G1 of the single-crystal silicon ingot is increased by means of cooling a lower portion of the single-crystal pulled silicon ingot, thereby increasing the pull rate of the single-crystal pulled silicon ingot.

(7) An upper portion of the single-crystal pulled silicon ingot is cooled, thereby promoting dissipation of internal conductive heat in the direction in which the ingot is pulled. Accordingly, a difference of a temperature gradient between the center of area G1 of the single-crystal pulled silicon ingot and the surface of area G1 is reduced, thus promoting formation of a perfect crystal in the direction of crystal growth. [Definitions of Terms]

The expression "heat applied to the single-crystal pulled ingot" corresponds to heat supplied to the single-crystal pulled ingot from surroundings thereof, such as heat radiated from the level of melt or heat emitted from a heater.

The expression "heat-shielding member" signifies a heat-shielding member disposed in a system for manufacturing a single-crystal ingot by use of the CZ technique. The heat-shielding member is usually disposed so as to surround a single-crystal ingot being pulled from a melt, thus controlling the amount of heat radiated from the melt or the amount of heat emitted from a heater. The heat-shielding member controls the amount of radiated heat and rectifies the flow of inactive gas introduced into a CZ furnace. Therefore, the heat-shielding member is also called a gas rectification cylinder.

The expression "measurement means for measuring the distance between the bottom of the heat-shielding member and the level of molten raw material" may signify any type of means which can accurately measure the distance between the bottom of the heat-shielding member and the level of the molten raw material. Preferably, there is employed a melt level detector as described in, for example, Japanese Patent application No. 071149/1999. As a matter of course, the distance from a point of measurement to the level of melt is determined through use of a conventional melt level sensor, and the temperature gradient G is inferred from the thus-determined distance, to a certain extent. However, the position of the lower end of the heat-shielding member changes during the course of pulling of the single-crystal ingot. Therefore, use of a sensor capable of accurately measuring the distance between the lower end of the heat-shielding member and the level of melt, such as that described in Japanese Patent application No. 071149/1999, is preferable.

The symbol "G1" designates a longitudinal temperature gradient (° C./mm) of a temperature region (a temperature region around the range from the temperature of the interface between solid and melt to 1350° C.) at which the pattern of a grown-in defect is determined. The symbol "G2" designates a longitudinal temperature gradient (° C./mm) of a temperature region at which voids are formed (a temperature region in the vicinity of 1120° C.) The longitudinal temperature gradient G1 and the longitudinal temperature gradient G2 are concepts important for manufacturing a commercially valuable silicon wafer.

The expression "perfect crystal" usually corresponds to a crystal which is free of crystal defects, such as voids or dislocation clusters, and is often called none defects crystal. Such a perfect crystal contains no grown-in defects, such as voids, and no oxide precipitates. However, the perfect crystal contains oxide precipitate nuclei which would serve as the basis for formation of oxide precipitates. Hence, in a case where a perfect crystal silicon wafer sliced from a perfect crystal ingot is subjected to heat treatment, oxide precipitates arise in the wafer.

A "cooler" for cooling a single-crystal pulled ingot may be embodied by any type of cooler, so long as the cooler cools a predetermined portion of the single-crystal pulled ingot. In view of reliable cooling of a specific location, a cooler comprising a piping system through which cooling water circulates or a heat pipe is desirably adopted (e.g., those described in Japanese Patent application Nos. 094695/1999 and 094697/1999).

The concept of the term "temperature gradient" implies the internal temperature gradient of the single-crystal pulled ingot actually measured by the temperature sensor and the internal temperature gradient of a coagulation section which are theoretically or empirically calculated from the actually-measured surface temperature of the ingot, as well as the temperature gradient of a single-crystal pulled ingot as actually measured by a temperatures sensor.

According to the method of the present invention, a ratio V/G is determined on the basis of a temperature gradient which is calculated from the distance between the level of melt and the bottom of the heat-shielding member as measured through use of a melt level sensor or a like device, On the basis of the thus-determined V/G, the temperature of a heater and the level of melt are controlled. The V/G ratio suitable for producing a crystal can be obtained according to a substance which is an object of production, as required. Therefore, it is evident that application of the method and system according to the present invention is not limited to silicon.

BEST MODE FOR CARRYING OUT THE INVENTION

[General Structure]

Figure 1:
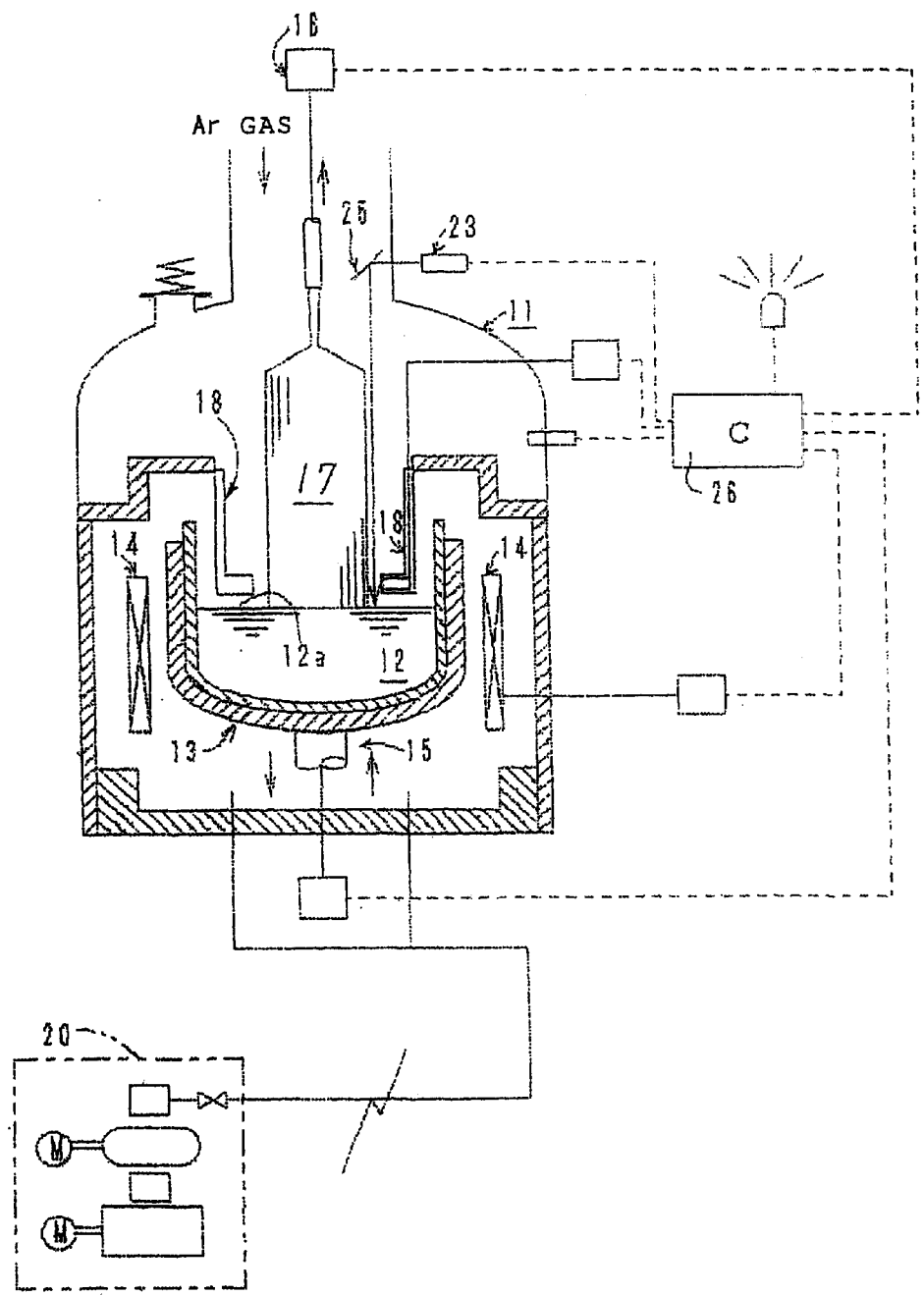
FIG. 1 is a block diagram showing a preferred embodiment of a system for manufacturing a single-crystal silicon ingot according to the present invention.

FIG. 1 is a block diagram showing a preferred embodiment of a system for manufacturing a single-crystal silicon ingot according to the present invention. As shown in FIG. 1, a system for manufacturing a single-crystal silicon ingot (hereinafter referred to simply as a "system") according to the present invention comprises a chamber 11 which is formed from a closed container; a crucible 13 disposed in the chamber 11 for producing and storing a silicon melt 12; a heater 14 disposed in the chamber 11 for heating the crucible 13; and an elevation device for vertically moving the crucible 13, as in the case of an ordinary system for manufacturing a Czochralski single-crystal silicon ingot (hereinafter referred to simply as an "ordinary system"). The system is further provided with an electrode for supplying power to the heater 14, thermally insulating material, a melt receiver, and an internal cylinder, as in the case of the ordinary system. The system is also provided with a puller 16 for pulling a silicon ingot 17; and a heat-shielding member 18 for protecting the silicon ingot 17 from the heat radiated from the silicon melt 12 and the heater 14.

Although omitted from the drawings, there is also provided a system for feeding and exhausting inactive gas usually provided for a system of this type. The heat-shielding member 18 doubles as a device for regulating an inactive gas flow channel. Further, the system is connected to a vacuum pump 20 for evacuating the inside of the chamber 11.

The system of the present invention shown in FIG. 1 is provided with a melt level sensor 23 commonly provided for a system of this type. A laser beam is radiated onto a level 12a of silicon melt by way of a prism 25, thus detecting the level of melt (i.e., the level of the silicon melt 12a). A controller 26 controls the heater 14, the elevation device 15, and the puller 16, in accordance with a signal output from the melt level sensor 23.

Figure 2:
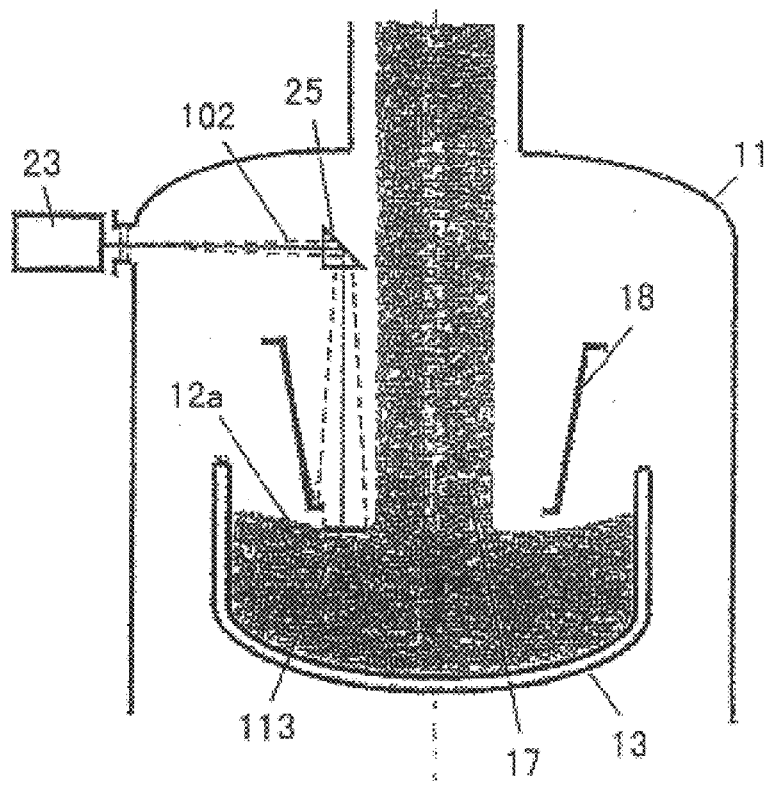
FIG. 2 is a block diagram for describing the principal section of the system according to the present invention.
Figure 2:
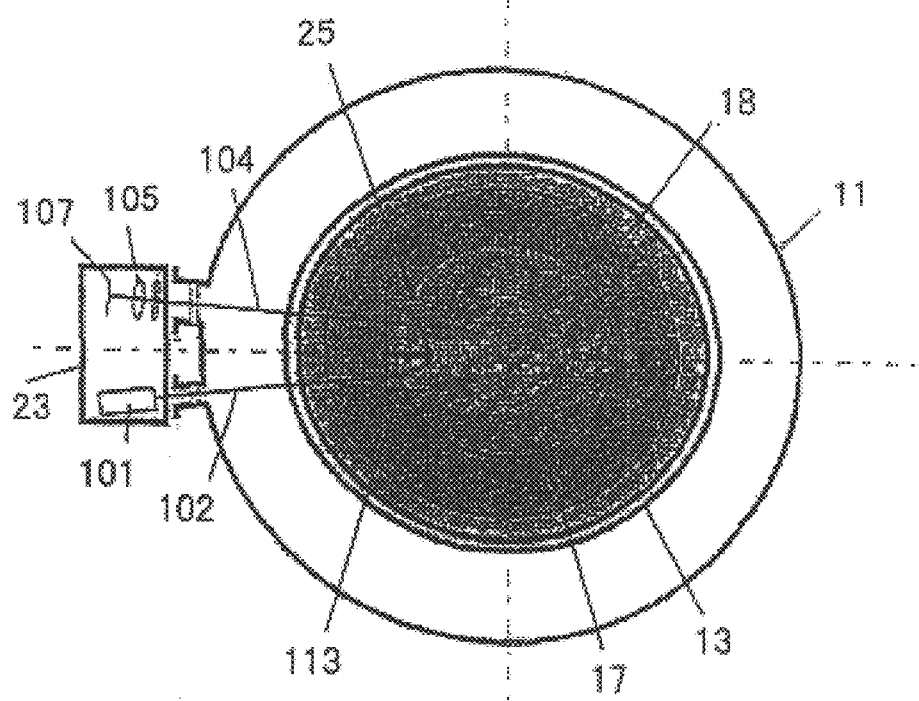

FIG. 2 is a block diagram for describing the principal section of the system according to the present invention. As is evidently from FIG. 2, in the system according to the present invention, a laser beam 102 emitted from a laser light source 101 is in principle radiated onto the level of the silicon melt 12 at an angle of θ, and the location of a measurement spot is obtained through the light reflected from the level of the melt. By means of the principle of triangulation, the level of the silicon melt 12a (i.e., a melt level) is calculated from the locations of the thus-obtained measurement points. The positions of the measurement spots are identified from positions on a two-dimensional light sensor 107 onto which mirror-reflected light 104 collected by a lens 105 is radiated (Japanese Patent application No. 071149/1999).

As shown in FIG. 2, in the system according to the present invention, a scan range 113 extends to a heat-shielding member 18, and the laser beam 102 is caused to scan across the scan range 113 extending from the silicon melt 12a to the heat-shielding member 18, thus enabling measurement of a distance (MSD: a melt screen distance) between the level of the silicon melt 12a and the heat-shielding member 18. The level of the silicon melt 12a is distinguished from the heat-shielding member 18, on the basis of a difference in reflectivity (see Japanese Patent application No. 071149/1999).

[Cooler]

Figure 3:
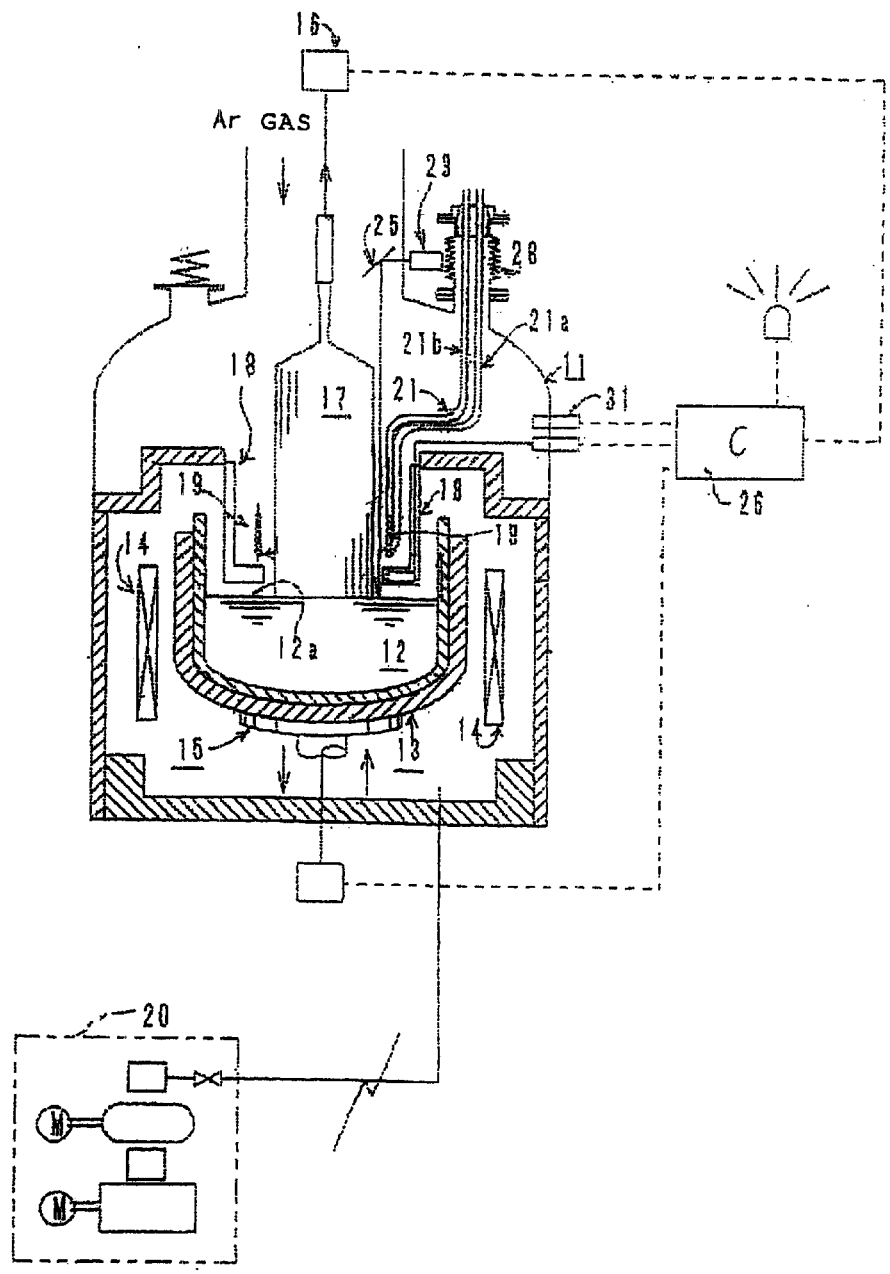
FIG. 3 is a block diagram showing another embodiment of the system equipped with a cooler.

FIG. 3 is a block diagram showing an embodiment of the system equipped with a cooler. In the drawings, like reference numerals designate like elements, and repetition of their explanations is omitted.

In the system according to the present invention, the cooler 19 is provided in a portion of the interior wall of the heat-shielding member 18. The cooler 19 is made up of a pipe through which cooling water circulates, and the cooling water is supplied from a feed pipe 21a. Bellows 28 are attached to portions of the chamber 11 from which a plumbing fixture 21 including the feed pipe 21a (or comprising the feed pipe 21a and a discharge pipe 21b) is guided into the chamber 11, thus maintaining the air-tight integrity and flexibility of the chamber 11.

In the system according to the present invention, in accordance with a signal output from the melt level sensor 23 (more specifically, the value of an MSD which has been determined from the result of the detection performed by the melt level sensor 23), the controller 26 controls the temperature of the heater 14 and the rate at which the puller 16 pulls the silicon ingot 17, such that the ratio V/G corresponding to a temperature region of 1350° C. or more assumes a value set in accordance with the purpose of production.

Simultaneously, the elevation device 15 is controlled under observation of the melt level sensor 23, as required, in accordance with the signal (i.e., the value of the MSD) output from the melt level sensor 23, such that the ratio V/G corresponding to a temperature range of 1350° C. or more assumes a value set for the purpose of production.

[Production of Perfect Crystal]

According to the present invention, cooling an upper portion of the single-crystal pulled ingot 17 promotes dissipation of internal conductive heat in the direction in which the ingot 17 is pulled. A difference of a temperature gradient between the center of area G1 of the single-crystal pulled silicon ingot and the surface of area G1 is reduced, thus enabling formation of a perfect crystal.

For example, in the case of production of an ingot from silicon, as a result of promotion of dissipation of internal conductive heat of the single-crystal pulled ingot 17 in the direction in which the ingot 17 is pulled, the V/G ratio is set to a range of 0.16 to 0.18 mm$^2$/° C.×min. in a temperature range of 1350° C. A ratio Gouter/Gcenter; i.e., a ratio of a mean value Gouter of G values obtained on the surface of the single-crystal pulled ingot to a mean value Gcenter of G values obtained in the center of the single-crystal pulled ingot, is set to a value of 1.10, thus enabling formation of a perfect crystal (see Japanese Patent application No. 330713/1998).

EXAMPLE

Figure 4A:
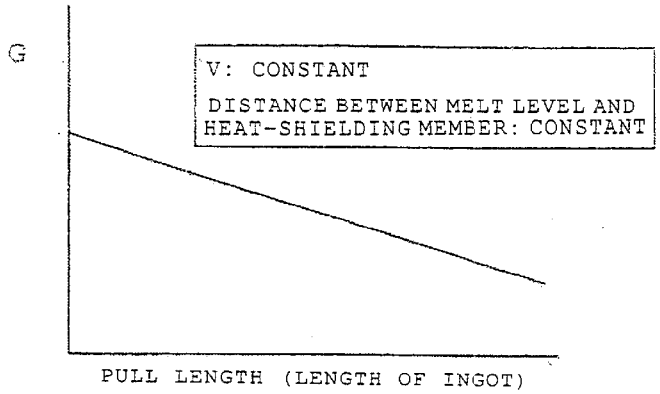
FIGS. 4A to 4C are graphs for describing the principle of a method of manufacturing a single-crystal silicon ingot according to the present invention.
Figure 4B:
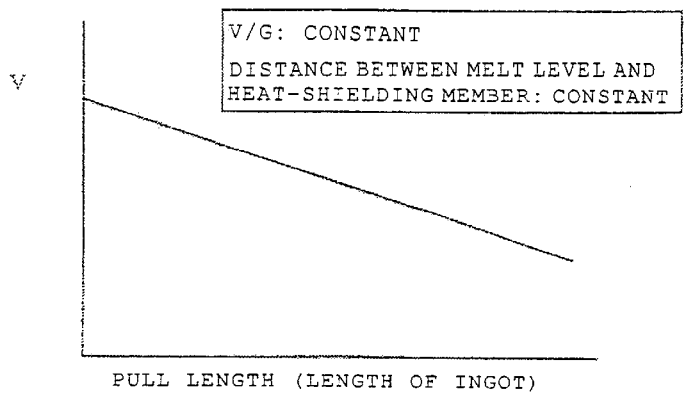
Figure 4C:
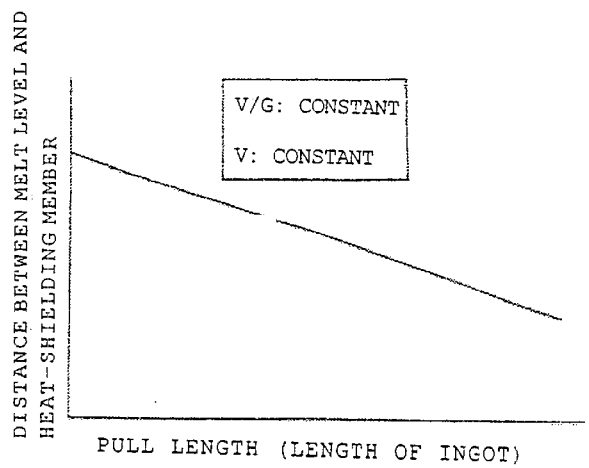

FIGS. 4A to 4C are graphs showing changes which have arisen in the temperature gradient G in association with pulling of a single-crystal silicon ingot from silicon melt.

As shown in FIG. 4A, in a case where the pull rate V of a single-crystal silicon ingot and the distance between the lower end of the heat-shielding member and the level of silicon melt (hereinafter referred to simply as a "melt screen distance (MSD)") are maintained constant, the temperature gradient G (i.e., G1) in the vicinity of the interface between solid and melt becomes smaller (as a single-crystal silicon grows longer and longer). As shown in FIG. 4B, in a case where the ratio V/G and the MSD are made constant, it is seen from FIG. 4B that the pull rate V of the single-crystal silicon ingot decreases in association with pulling thereof. As shown in FIG. 4C, under condition that the ratio V/G and V are maintained constant, the temperature gradient G can be maintained constant by reducing the MSD.

The reduction of MSD can be achieved by increasing the feed rate of the crucible with respect to the weight of crystal to be pulled per hour. As a result, the temperature gradient G can also be increased. Conversely, if the feed rate of the crucible is reduced with respect to the weight of crystal to be pulled per hour, a reduction in the temperature gradient G is enabled by means of increasing the MSD. A method of controlling the temperature gradient G will be described more specifically. The longer the crystal grows, the smaller the temperature gradient G in the vicinity of interface between solid and melt. A program is set in advance such that the MSD becomes smaller in the longitudinal direction, thereby enabling constant control of the value of the temperature gradient G.

The growth rate V is controlled, as required, in the manner as mentioned previously, and the temperature gradient G is also controlled by control of the MSD, thereby enabling control such that the ratio V/G matches a set value. Simultaneously, the ratio V/G is set reliably by simultaneous control of the power of the heater.

From the above-described embodiment, it is understood that the temperature gradient G in the vicinity of the interface between solid and melt (i.e., G1) is greatly dependent on the MSD. Accordingly, the ratio V/G can be stably controlled by means of determining, through simulation, the amount of change in a longitudinal temperature gradient, which varies according to the length of a crystal; and by taking, into a single-crystal pull program, a preset value of MSD (the distance between the lower end of the heat-shielding member and the level of the silicon melt, i.e., Melt Screen Distance) for controlling the pull rate V and the temperature gradient G in the vicinity of interface between solid and melt.

This means that the present invention is suitable for producing a perfect crystal, which would not be produced unless the ratio V/G is controlled within a very narrow range. More specifically, the present invention enables stable control of the ratio V/G in a temperature range of 1350° C. of single-crystal silicon pulled ingot so that a perfect crystal can grow. In contrast with a case where a perfect crystal is produced by use of a conventional system, an area in which a perfect crystal grows can be extended. More specifically, the system according to the present invention controls, on the basis of the actually-measured distance between the lower end of the heat-shielding member and the level of silicon melt(i.e., the MSD), conditions for pulling a single-crystal silicon pulled ingot; that is, the amount of heat applied to silicon melt, the level of silicon melt, and the pull rate of a single-crystal silicon pulled ingot. The area in which a perfect crystal grows can be readily extended in the direction of crystal growth.

As has been described above, the present invention enables easy control of a temperature gradient G, without use of a complicated mechanism which has been used conventionally, such as a mechanism for vertically moving a radiation-shielding member (i.e., a heat-shielding member), a radiation reflection member which has a high reflectivity and is disposed at a position above melt, and a mechanism for actuating the radiation reflection member. Accordingly, a perfect-crystal region can extend with superior reproducibility in the direction of crystal growth.

We claim:

1. A system for manufacturing a single-crystal ingot by pulling a single-crystal ingot from molten raw material which has a seat-shielding member disposed so as to surround the single-crystal ingot being pulled for controlling the amount of heat applied to the single-crystal pulled ingot, the system comprising:

measurement means for measuring a distance between a bottom of the heat-shielding member and a level of the molten raw material; and a controller for controlling the requirements of pulling the single-crystal ingot on the basis of the distance measured by the measurements means.

2. The system as defined in claim 1, comprising a cooler for cooling a portion of the single-crystal pulled ingot.

3. The system as defined in claim 2, wherein the system corresponds to a system for manufacturing a single-crystal silicon ingot, and the requirements of pulling a single-crystal silicon ingot correspond to any factor selected from a group comprising an amount of heat applied to silicon melt, a level of silicon melt, and a pull rate of single-crystal ingot.

4. system as defined in claim 3, wherein a perfect crystal silicon wafer is produced by means of slicing the single-crystal silicon ingot.

5. The system as defined in claim 1, wherein the system corresponds to a system for manufacturing a single-crystal silicon ingot, and the requirements of pulling a single-crystal silicon ingot, and the requirements of pulling a single-crystal silicon ingot correspond to any factor selected from a group comprising an amount of heat applied to silicon melt, a level of silicon melt, and a pull rate of a single-crystal silicon ingot.

6. The system as defined in claim 5, wherein a perfect crystal silicon wafer is produced by means of slicing the single-crystal silicon ingot.

7. A method of manufacturing a single-crystal ingot by pulling a single-crystal ingot from molten raw material, the method comprising the steps of:

measuring a distance between a level of molten raw material and a bottom of a heat-shielding member disposed so as to surround the single-crystal silicon being pulled for controlling an amount of heat applied to the single-crystal pulled ingot; and controlling any factor for pulling a single-crystal silicon ingot selected from a group comprising an amount of heat applied to silicon melt, a level of silicon melt, and a pull rate of the single-crystal pulled silicon ingot, thereby controlling a temperature gradient of area G1 of the single-crystal pulled silicon ingot.

8. The method as defined in claim 7, wherein the temperature gradient of area G1 of the single-crystal silicon ingot is increased by means of cooling a lower portion of the single-crystal pulled silicon ingot, thereby increasing the pull rate of the single-crystal pulled silicon ingot.

9. The method as defined in claim 7, wherein an upper portion of the single-crystal pulled silicon ingot is cooled, thereby promoting dissipation of internal conductive heat in a direction in which the ingot is pulled, and a difference of a temperature gradient between the, center of area G1 of the single-crystal pulled silicon ingot and the surface of area G1 is reduced, thus promoting formation of a perfect crystal in the direction of crystal growth.

* * * * *